(12) United States Patent
Kobayashi et al.

(10) Patent No.: US 8,856,857 B2
(45) Date of Patent: Oct. 7, 2014

(54) RECEIVING DEVICE, RECEIVING METHOD, AND PROGRAM

(75) Inventors: Kenichi Kobayashi, Tokyo (JP); Naoki Yoshimochi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/002,013

(22) PCT Filed: Mar. 23, 2012

(86) PCT No.: PCT/JP2012/057535
§ 371 (c)(1),
(2), (4) Date: Aug. 28, 2013

(87) PCT Pub. No.: WO2012/137611
PCT Pub. Date: Oct. 11, 2012

(65) Prior Publication Data
US 2013/0332980 A1 Dec. 12, 2013

(30) Foreign Application Priority Data
Apr. 1, 2011 (JP) ................................. 2011-082146

(51) Int. Cl.
*H04N 7/16* (2011.01)
*H03G 3/30* (2006.01)
*H04N 5/52* (2006.01)
*H04N 5/455* (2006.01)
*H04N 21/426* (2011.01)
*H04N 21/438* (2011.01)

(52) U.S. Cl.
CPC ....... *H04N 21/42607* (2013.01); *H03G 3/3078* (2013.01); *H04N 5/52* (2013.01);
(Continued)

(58) Field of Classification Search
USPC ......... 725/151, 150, 149, 146, 139, 131, 130, 725/127, 116, 68, 79, 93; 348/300, 372, 348/507, 553, 656, 706, 707, 725, 726, 729, 348/730, 785; 330/136, 169, 254, 260, 278, 330/282, 285, 291, 297, 369; 455/126, 455/127.2, 127.3, 194.2, 291, 293, 309, 341
See application file for complete search history.

(56) References Cited

U.S. PATENT DOCUMENTS 5,737,697 A * 4/1998 Yamada ........................ 455/126
(Continued)

FOREIGN PATENT DOCUMENTS

| JP | 11-205278 | 7/1999 |
|---|---|---|
| JP | 2003-008676 | 1/2003 |

(Continued)

OTHER PUBLICATIONS

International Search Report; International Application No. PCT/JP2012/057535; International Filing Date: Mar. 23, 2012; Completion of the International Search Report: Apr. 10, 2012. (PCT/ISA/210).

(Continued)

*Primary Examiner* — Jefferey Harold
*Assistant Examiner* — Mustafizur Rahman
(74) *Attorney, Agent, or Firm* — Rader, Fishman & Grauer PLLC

(57) ABSTRACT

This technique relates to a receiving device, a receiving method, and a program that can demodulate transmitted signals with high accuracy. A receiving device of this disclosure includes: an amplifying unit that amplifies a received signal; an adjusting unit that adjusts gain of the amplifying unit in accordance with power of the signal; a demodulating unit that demodulates the amplified signal; and a detecting unit that detects an interval from the signal, information having the same content continuously appearing in the interval. The adjusting unit restricts the process of adjusting the gain of the amplifying unit in accordance with a result of the detection of the interval. This disclosure can be applied to receiving devices that receive broadcast signals compliant with DVB-C2 via a CATV network.

6 Claims, 13 Drawing Sheets

(52) U.S. Cl.
 CPC ........... H04N 5/455 (2013.01); H04N 21/4382 (2013.01)
 USPC ........... 725/151; 725/150; 725/149; 725/146; 725/139; 725/131; 725/130; 725/127; 725/116; 725/68; 725/79; 725/93; 348/300; 348/372; 348/507; 348/553; 348/656; 348/706; 348/707; 348/725; 348/726; 348/729; 348/730; 348/785; 330/136; 330/169; 330/254; 330/260; 330/278; 330/282; 330/285; 330/291; 330/297; 455/126; 455/127.2; 455/127.3; 455/194.2; 455/291; 455/293; 455/309; 455/341

(56) References Cited

U.S. PATENT DOCUMENTS

| | | | | |
|---|---|---|---|---|
| 7,602,865 | B2* | 10/2009 | Choi | 375/345 |
| 7,622,992 | B2* | 11/2009 | Liu | 330/285 |
| 7,830,992 | B2* | 11/2010 | Ao | 375/345 |
| 8,238,494 | B2* | 8/2012 | Sher et al. | 375/345 |
| 2005/0047615 | A1* | 3/2005 | Kawamura et al. | 381/120 |
| 2005/0141656 | A1* | 6/2005 | Choi | 375/345 |
| 2008/0036534 | A1* | 2/2008 | Liu | 330/136 |
| 2008/0191800 | A1* | 8/2008 | Fang et al. | 330/9 |
| 2009/0028019 | A1* | 1/2009 | Miyashita et al. | 369/53.2 |
| 2009/0029661 | A1* | 1/2009 | Ao | 455/127.2 |

FOREIGN PATENT DOCUMENTS

| | | |
|---|---|---|
| JP | 2003-078469 | 3/2003 |
| JP | 2010-041459 | 2/2010 |
| JP | 2010-087791 | 4/2010 |
| WO | WO-2008/139672 | 11/2008 |

OTHER PUBLICATIONS

Written Opinion of the International Searching Authority; International Application No. PCT/JP2012/057535; International Filing Date: Mar. 23, 2012; Dated: Apr. 24, 2012. (Form PCT/ISA/220 and PCT/ISA/237).

* cited by examiner

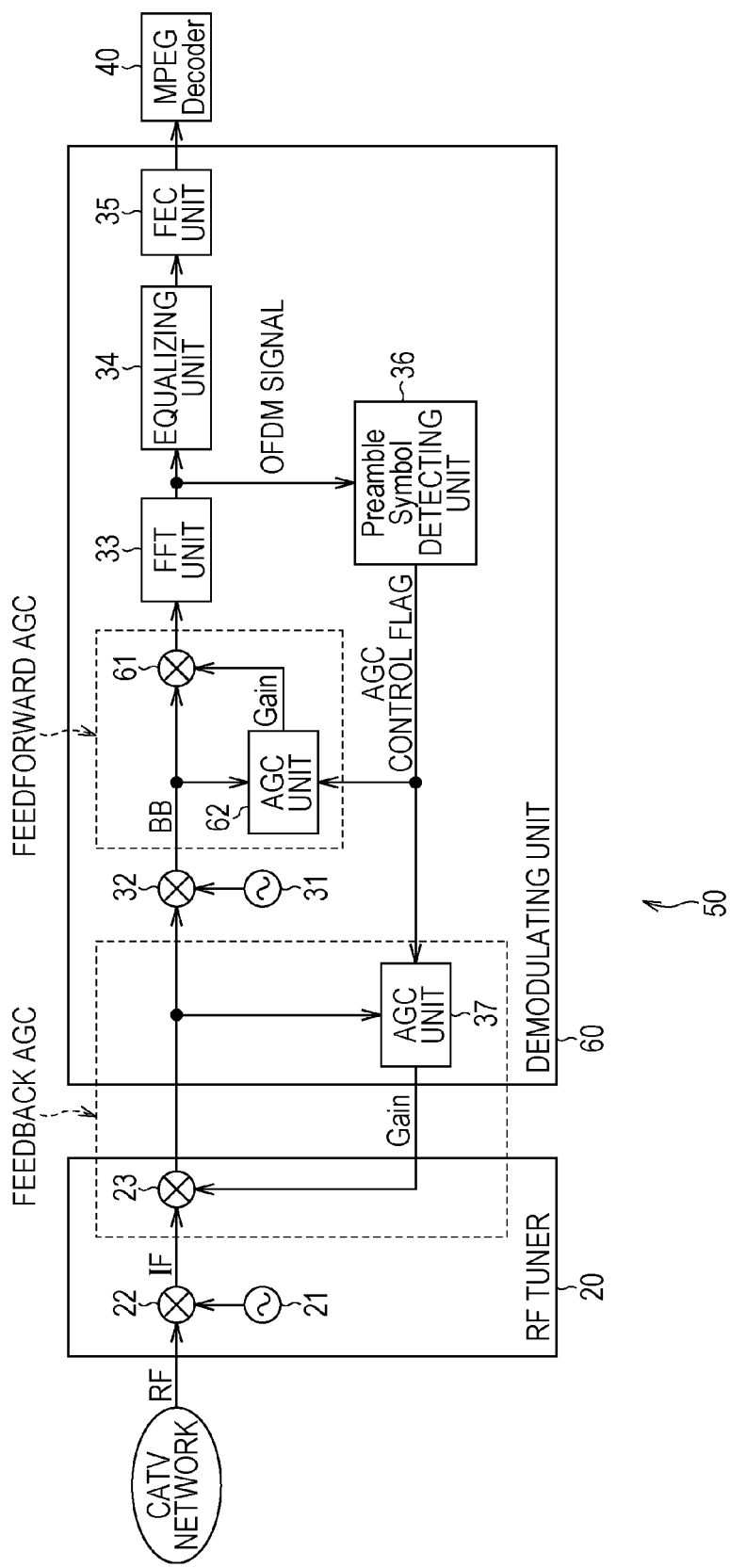

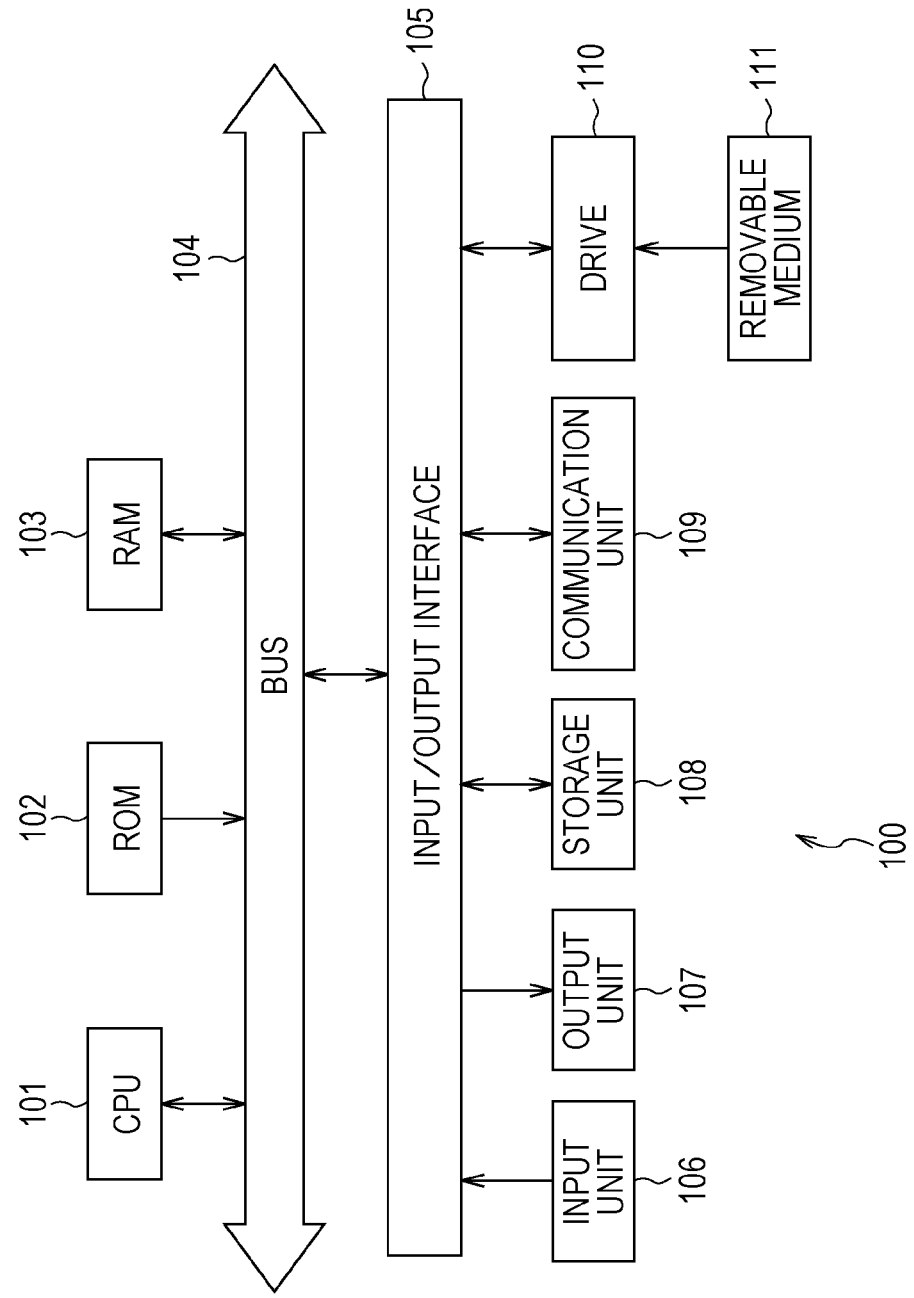

RECEIVING DEVICE, RECEIVING METHOD, AND PROGRAM

TECHNICAL FIELD

The present invention relates to receiving devices, receiving methods, and programs, and more particularly, to a receiving device, a receiving method, and a program that are suitable for receiving broadcast signals compliant with the next-generation cable broadcasting standards (DVB (Digital Video Broadcasting)-C2).

BACKGROUND ART

DVB-C is known as standards which were set as the cable television broadcasting standards in 1994 and are employed mainly in Europe, and DVB-C2 is the standards that have been suggested as next-generation cable television broadcasting standards to replace DVB-C (see Non-Patent Document 1, for example).

While 256-QAM is used in constellations compliant with DVB-C, 4096-QAM is used compliant with DVB-C2. Accordingly, with DVB-C2, the capacity of information transmission via a CATV network can be made much larger than those with conventional standards.

CITATION LIST

Non-Patent Document

Non-Patent Document 1: DVB-C2 written standard [Digital Video Broadcasting (DVB); Frame structure channel coding and modulation for a second generation digital transmission system for cable systems (DVB-C2)] DVB Document A138

SUMMARY OF THE INVENTION

Problems to be Solved by the Invention

As described above, high-density 4096-QAM is used for constellations compliant with DVB-C2, and thus, a larger transmission capacity is realized. However, as the constellations have higher densities, transmitted signals are required to be demodulated with higher accuracy.

This disclosure is being made in view of those circumstances, and an object thereof is to demodulate transmitted signals with high accuracy.

Solutions to Problems

A receiving device as one aspect of this disclosure includes: an amplifying unit that amplifies a received signal; an adjusting unit that adjusts gain of the amplifying unit in accordance with power of the signal; a demodulating unit that demodulates the amplified signal; and a detecting unit that detects an interval from the signal, information having the same content continuously appearing in the interval, wherein the adjusting unit restricts the process of adjusting the gain of the amplifying unit in accordance with a result of the detection of the interval.

The adjusting unit may suspend the process of adjusting the gain of the amplifying unit in the interval.

The adjusting unit may lower the following rate of the gain of the amplifying unit when the gain is adjusted in accordance with the amplified power of the signal in the interval.

The adjusting unit may be of at least one of a feedback type that has the amplified signal as an input, and a feedforward type that has the pre-amplification signal as an input.

A receiving method as the one aspect of this disclosure is a receiving method used by a receiving device that includes: an amplifying unit that amplifies a received signal; an adjusting unit that adjusts gain of the amplifying unit in accordance with power of the signal; and a demodulating unit that demodulates the amplified signal. The receiving method includes: a detecting step of detecting an interval from the signal, information having the same content continuously appearing in the interval; and a restricting step of restricting the process of adjusting the gain of the amplifying unit in accordance with a result of the detection of the interval.

A program as the one aspect of this disclosure is a program for control in a receiving device that includes: an amplifying unit that amplifies a received signal; an adjusting unit that adjusts gain of the amplifying unit in accordance with power of the signal; and a demodulating unit that demodulates the amplified signal. The program causes a computer of the receiving device to perform an operation that includes: a detecting step of detecting an interval from the signal, information having the same content continuously appearing in the interval; and a restricting step of restricting the process of adjusting the gain of the amplifying unit in accordance with a result of the detection of the interval.

In the one aspect of this disclosure, an interval in which information having the same content continuously appears is detected from a signal, and the process of adjusting the gain of the amplifying unit is restricted in accordance with a result of the detection of the interval.

Effects of the Invention

According to one aspect of the present invention, transmitted signals can be demodulated with high accuracy.

BRIEF DESCRIPTION OF DRAWINGS

FIG. 12 is a block diagram showing a second example structure of a receiving device as an embodiment of the invention.
FIG. 13 is a block diagram showing an example structure of a computer.

MODES FOR CARRYING OUT THE INVENTION

The following is a detailed description of best modes for carrying out this disclosure (hereinafter referred to as embodiments), with reference to the drawings.

<1. DVB-C2>

Figure 1:
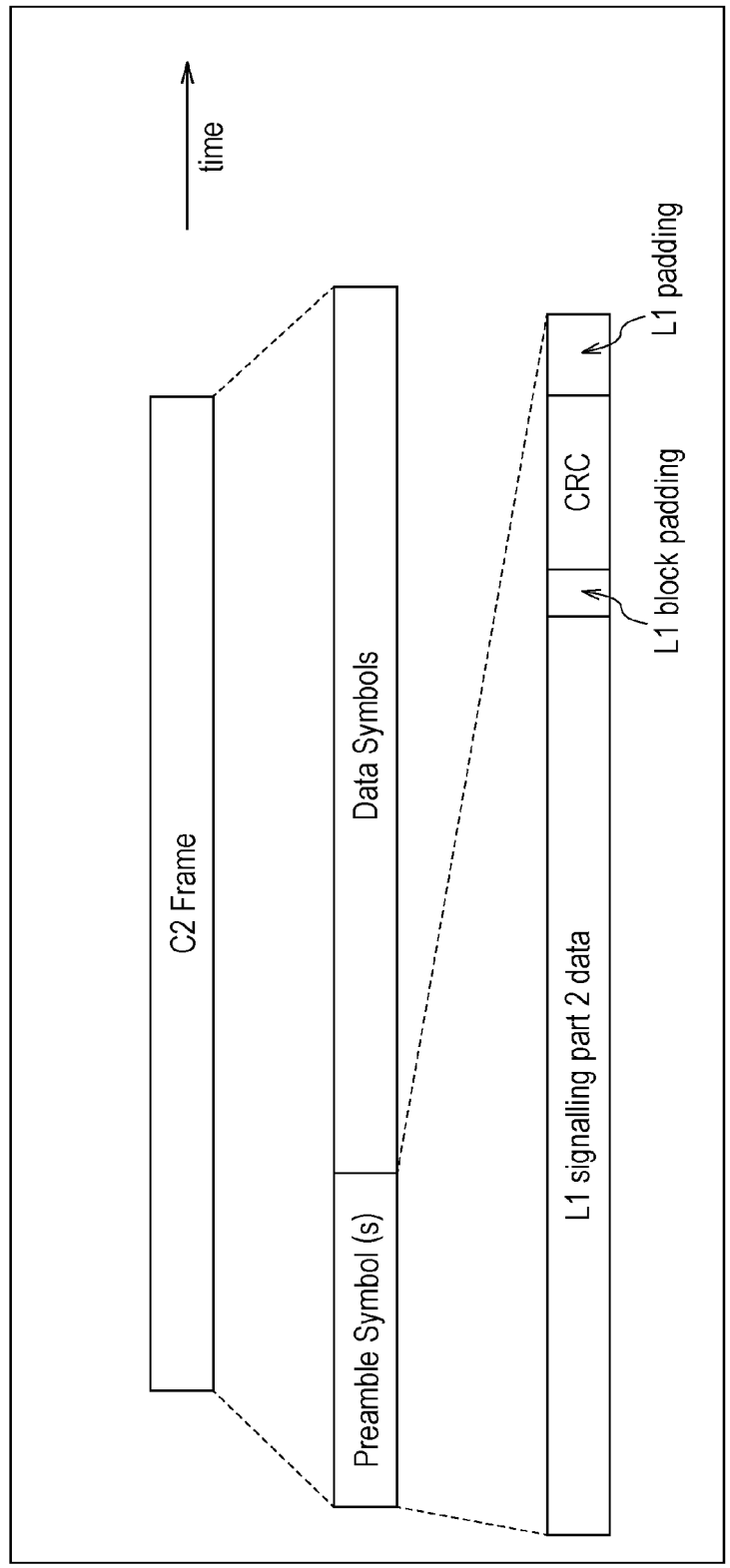
FIG. 1 is a diagram showing a frame structure of DVB-C2.
Figure 2:
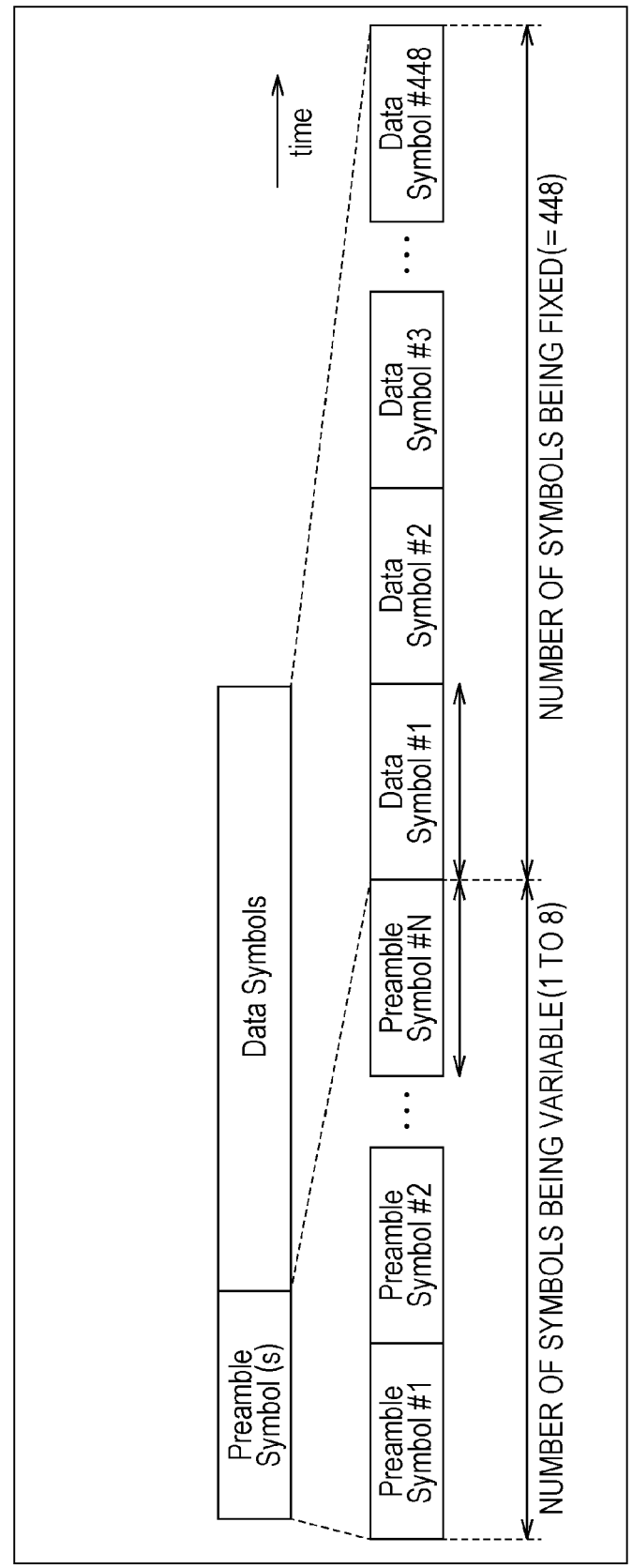
FIG. 2 is a diagram showing a Symbol structure of DVB-C2.
Figure 3:
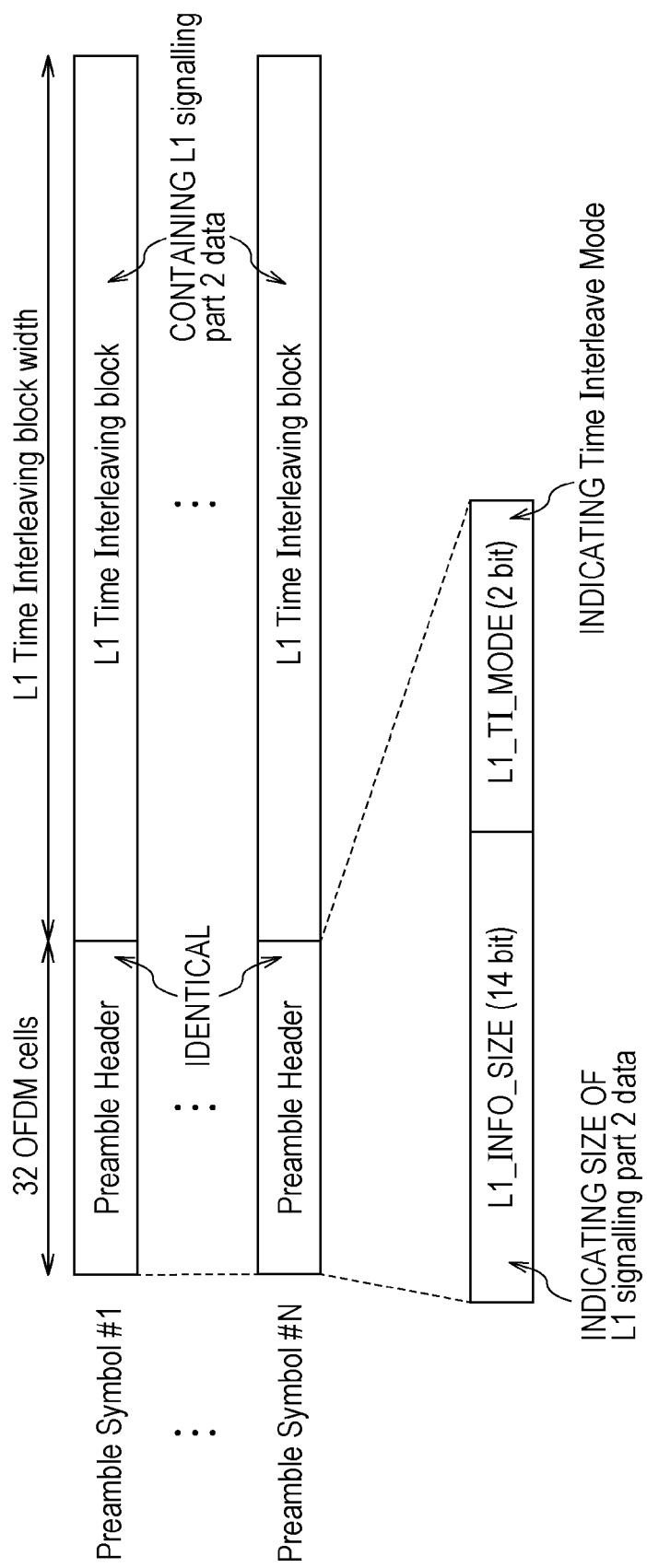
FIG. 3 is a diagram showing a Preamble Header structure of DVB-C2.

First, DVB-C2 is described. FIG. 1 shows a frame structure of DVB-C2, FIG. 2 shows a Symbol structure of DVB-C2, and FIG. 3 shows a Preamble Header structure.

Specifically, in a frame (C2 Frame) of DVB-C2, Preamble Symbol (s) consisting of a variable number, which is one through eight, of Preamble Symbols #1 through #N are placed at the top, and Data Symbols consisting of a fixed number, which is 448, of Data Symbols #1 through #448 follow the Preamble Symbol(s). The symbol length of one Preamble Symbol and the symbol length of one Data Symbol are the same.

Information called L1 signaling part 2, which is necessary for decoding data stored in the Data Symbols, is stored in the Preamble Symbol(s). The information length (L1_INFO_SIZE) of L1 signaling part 2 is determined in accordance with the number of Data Slices or the number of PLPs, and the information length of L1 signaling part 2 becomes larger as the number of Data Slices and the number of PLPs become larger.

The number of Preamble Symbols forming the Preamble Symbol(s) is determined in accordance with the information length (L1_INFO_SIZE) of L1 signaling part 2 and the Mode (L1_TI_MODE) of Time Interleave indicating the distribution arrangement in the temporal direction at the time of transmission of L1 signaling part 2. L1_INFO_SIZE and L1_TI_MODE are stored in the Preamble Header provided at the top of each Preamble Symbol.

L1_INFO_SIZE has 14 bits assigned thereto.

L1_TI_MODE has two bits assigned thereto, 00 representing No Time Interleaving, 01 representing Best Fit, 10 representing 4 OFDM Symbols, 11 representing 8 OFDM Symbols.

No Time Interleaving represented by L1_TI_MODE=00 means transmission of L1 signaling part 2 without distribution in the temporal direction. Best Fit represented by L1_TI_MODE=01 means that the Preamble Symbol (s) is formed with Preamble Symbols, with the number of the Preamble Symbols depending on the information length (L1_INFO_SIZE) of L1 signaling part 2. The 4 OFDM symbols represented by L1_TI_MODE=10 means that the Preamble Symbol (s) is formed with four Preamble Symbols. The 8 OFDM symbols represented by L1_TI_MODE=11 means that the Preamble Symbol (s) is formed with eight Preamble Symbols.

As L1_TI_MODE is set to 01, 10, or 11, L1 signaling part 2 can be distributed in the temporal direction, and accordingly, an accuracy increase in the correction of defects or errors can be expected at the time of reception.

Figure 4:
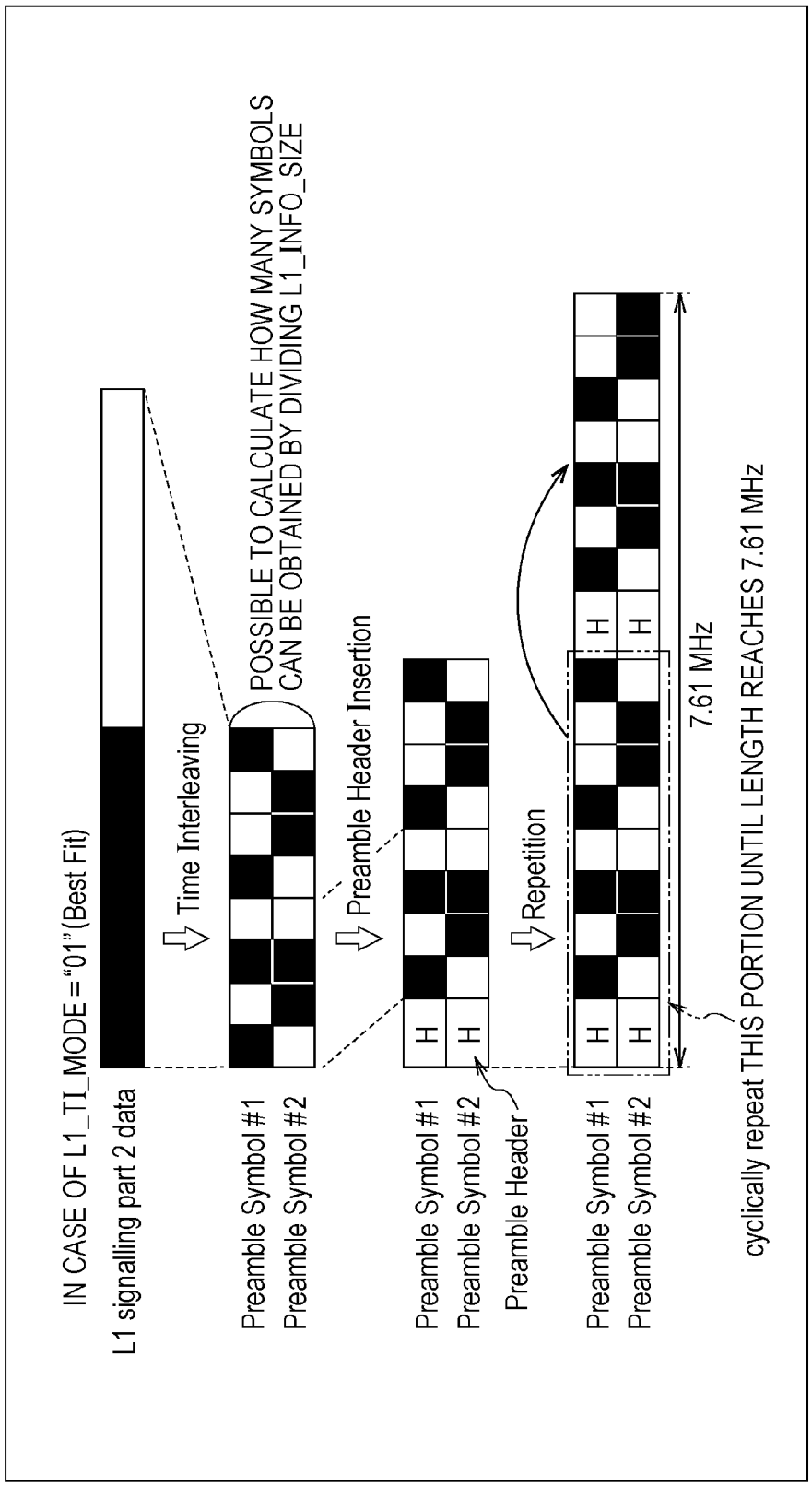
FIG. 4 is a diagram for explaining a case where L1_TI_MODE=01.

FIG. 4 shows the case where L1_TI_MODE=01 (Best Fit). In this case, the information length of L1 signaling part 2 is equivalent to two Preamble Symbols. Therefore, L1 signaling part 2 is divided into portions of a predetermined size, and is equally distributed to the two Preamble Symbols #1 and #2. Identical Preamble Headers are then added to those Preamble Symbols. Further, Preamble Headers and divided L1 signaling part 2 are repeatedly placed until the width of 7.61 MHz is obtained in the frequency direction. Through the repetitive placement in the frequency direction, the S/N ratio at the time of reception can be increased.

Figure 5:
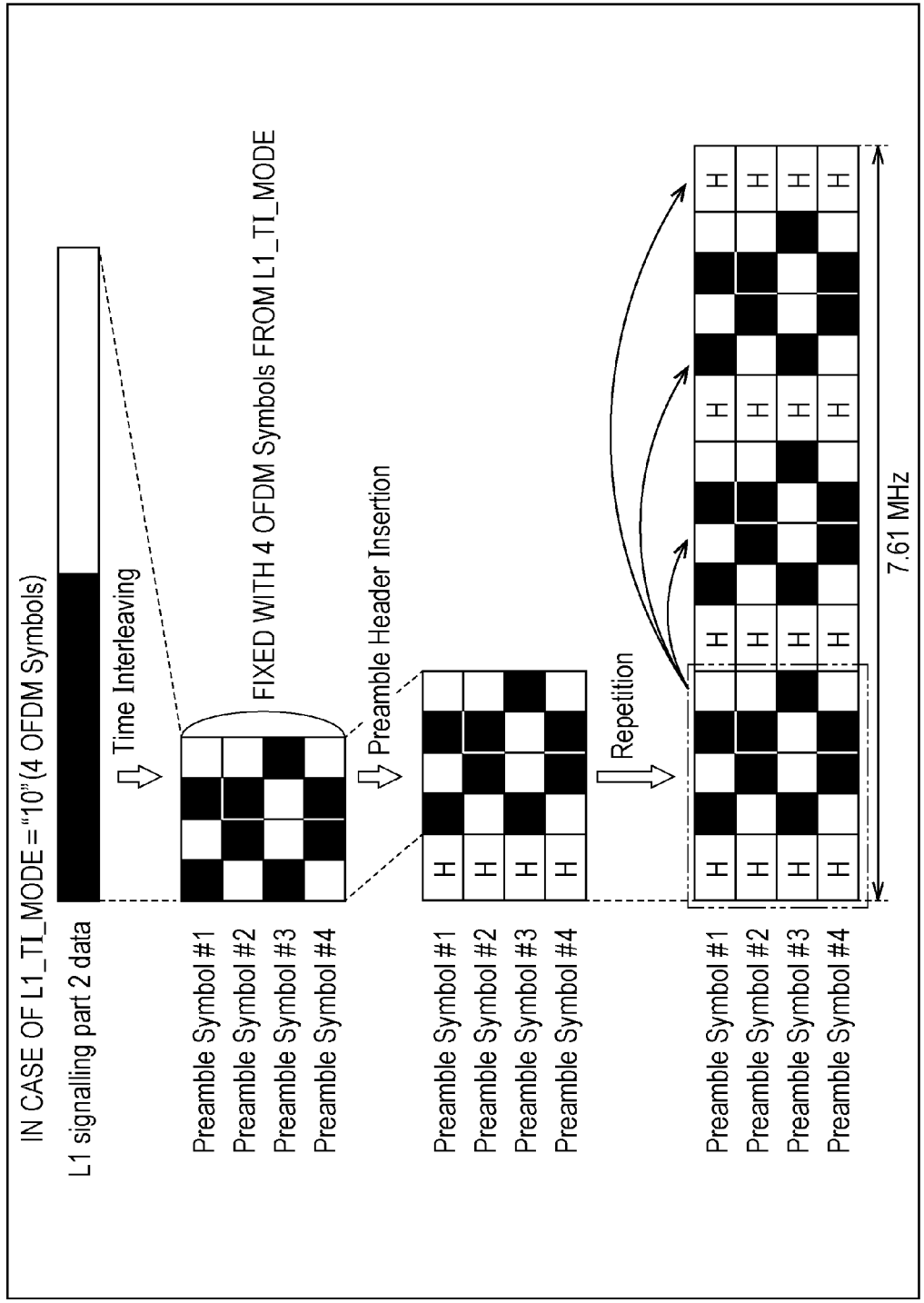
FIG. 5 is a diagram for explaining a case where L1_TI_MODE=10.

FIG. 5 shows the case where L1_TI_MODE=10 (4 OFDM Symbols). In this case, L1 signaling part 2 is divided into portions of a predetermined size, and is equally distributed to the four Preamble Symbols #1 through #4, regardless of the information length of L1 signaling part 2. Identical Preamble Headers are then added to those Preamble Symbols. Further, Preamble Headers and divided L1 signaling part 2 are repeatedly placed until the width of 7.61 MHz is obtained in the frequency direction. Through the repetitive placement in the frequency direction, the S/N ratio at the time of reception can be increased.

Although not shown in any of the drawings, in the case where L1_TI_MODE=11 (8 OFDM Symbols), L1 signaling part 2 is divided into portions of a predetermined size, and is equally distributed to the eight Preamble Symbols #1 through #8, regardless of the information length of L1 signaling part 2. Identical Preamble Headers are then added to those Preamble Symbols. Further, Preamble Headers and divided L1 signaling part 2 are repeatedly placed until the width of 7.61 MHz is obtained in the frequency direction.

Figure 6:
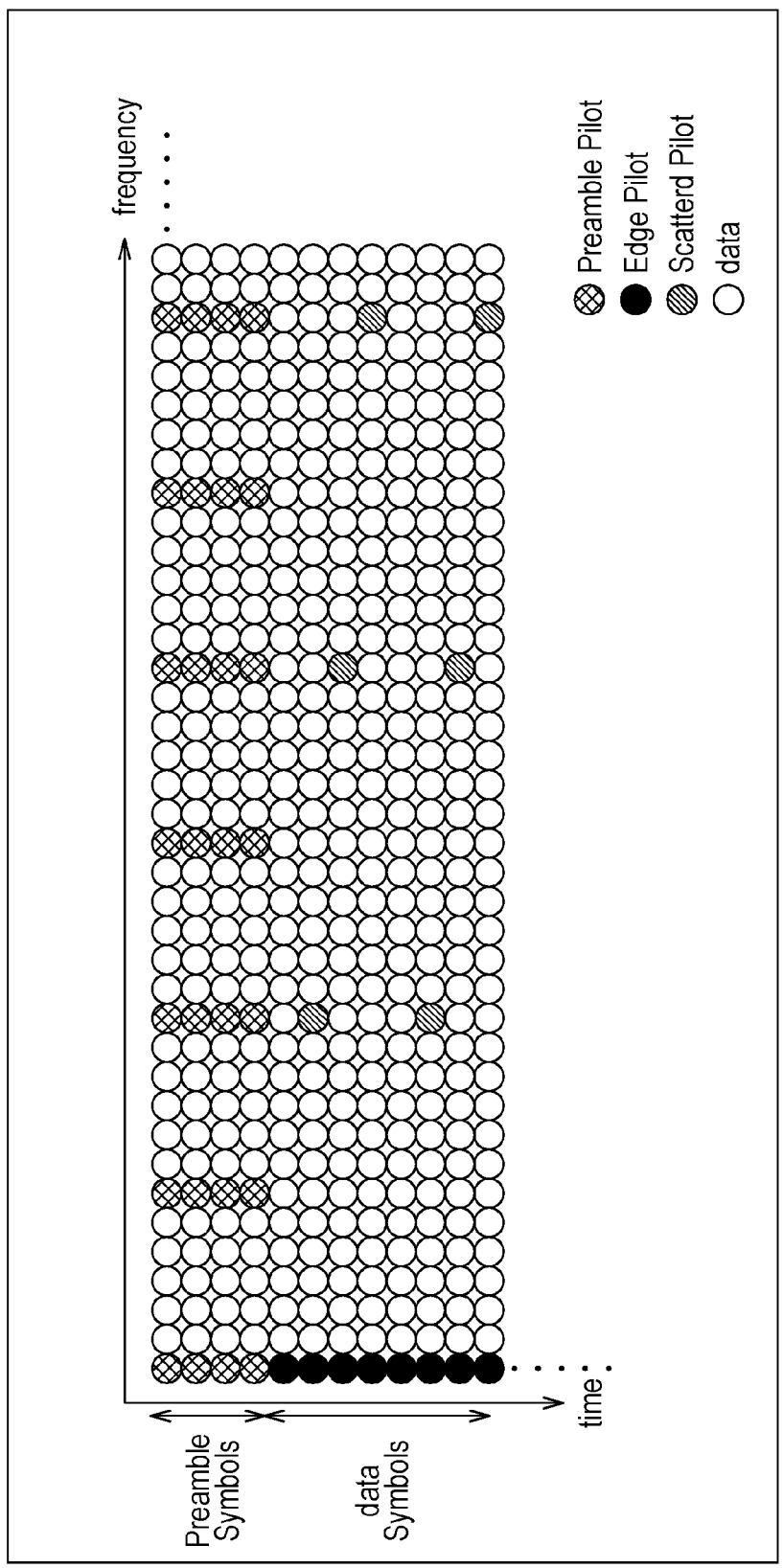
FIG. 6 is a diagram showing arrangement of Pilot signals.

When a frame of DVB-C2 is transmitted, Preamble Pilot signals are placed for Preamble Symbol(s) at the ratio of 1 carrier to 6 carriers, and Scattered Pilot signals are placed for Data Symbols at the ratio of 1 carrier to 12 or 24 carriers, as shown in FIG. 6.

In a receiving device, the Preamble Symbol (s) is detected based on the interval difference between the Preamble Pilot signals and the Scattered Pilot signals. L1 signaling part 2 is read from the detected Preamble Symbol(s), and the data stored in the Data Symbols is decoded.

When the information length of L1 signaling part 2 is short, the following phenomenon might occur.

Figure 7:
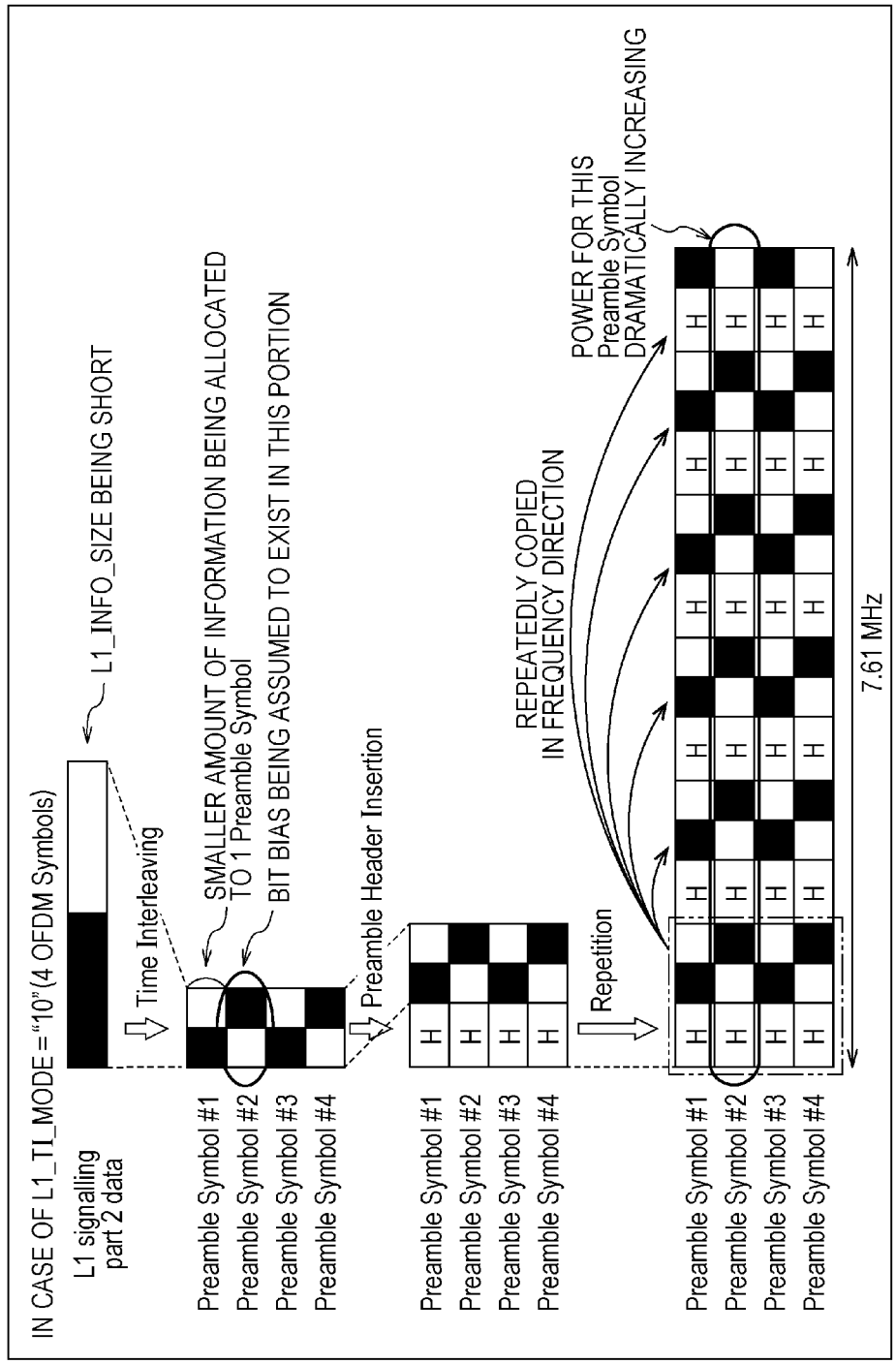
FIG. 7 is a diagram for explaining a phenomenon that occurs when the information length of L1 signaling part 2 is short.

FIG. 7 shows a phenomenon that might occur when the information length of L1 signaling part 2 is short. As described above, in the case where L1_TI_MODE=10 (4 OFDM Symbols), the amount of information equally distributed to the four Preamble Symbols #1 through #4 is small if the information length of L1 signaling part 2 is short. As a result, the number of times the placement is repeated is large. If there is a bias in the information bits (only bits "1" are continuously placed or only bits "0" are continuously placed) at Preamble Symbol #2, for example, the power of Preamble Symbol #2 becomes much larger or smaller than the power before and after.

Meanwhile, a conventional receiving device that receives broadcast signals via a CATV network performs AGC (Auto Gain Control) to adjust gain when amplifying received signals in accordance with the intensity (power) of the broadcast signals. AGC is to adjust gain at the time of amplification so that the power of the signals to be input in the later stages becomes constant.

Figure 8:
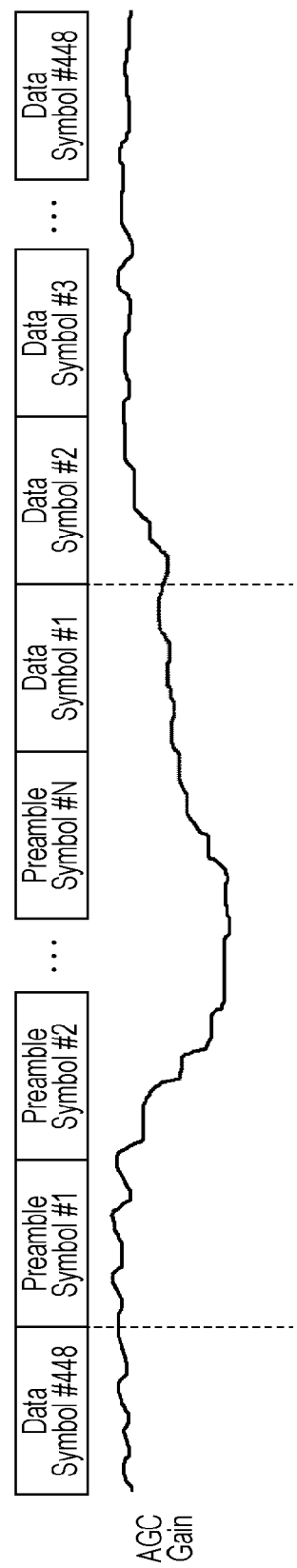
FIG. 8 is a diagram showing the gain variation corresponding to the phenomenon shown in FIG. 7 in a conventional receiving device.

Therefore, in a case where a broadcast signal having the power of Preamble Symbol #2 much larger or smaller than that before and after, the gain might unnecessarily fluctuate as shown in FIG. 8. As a result, the power of the signals to be input in the later stages fluctuates unnecessarily, and demodulation errors easily occur. Such demodulation errors often appear in the case of DBV-C2, which employs high-density 4096 QAM in constellations.

In view of this, a receiving device that can cope with a bias in the power of broadcast signals that is caused by repetitive bit biases as described above.

<2. Embodiments>

[First Example Structure of a Receiving Device]

Figure 9:
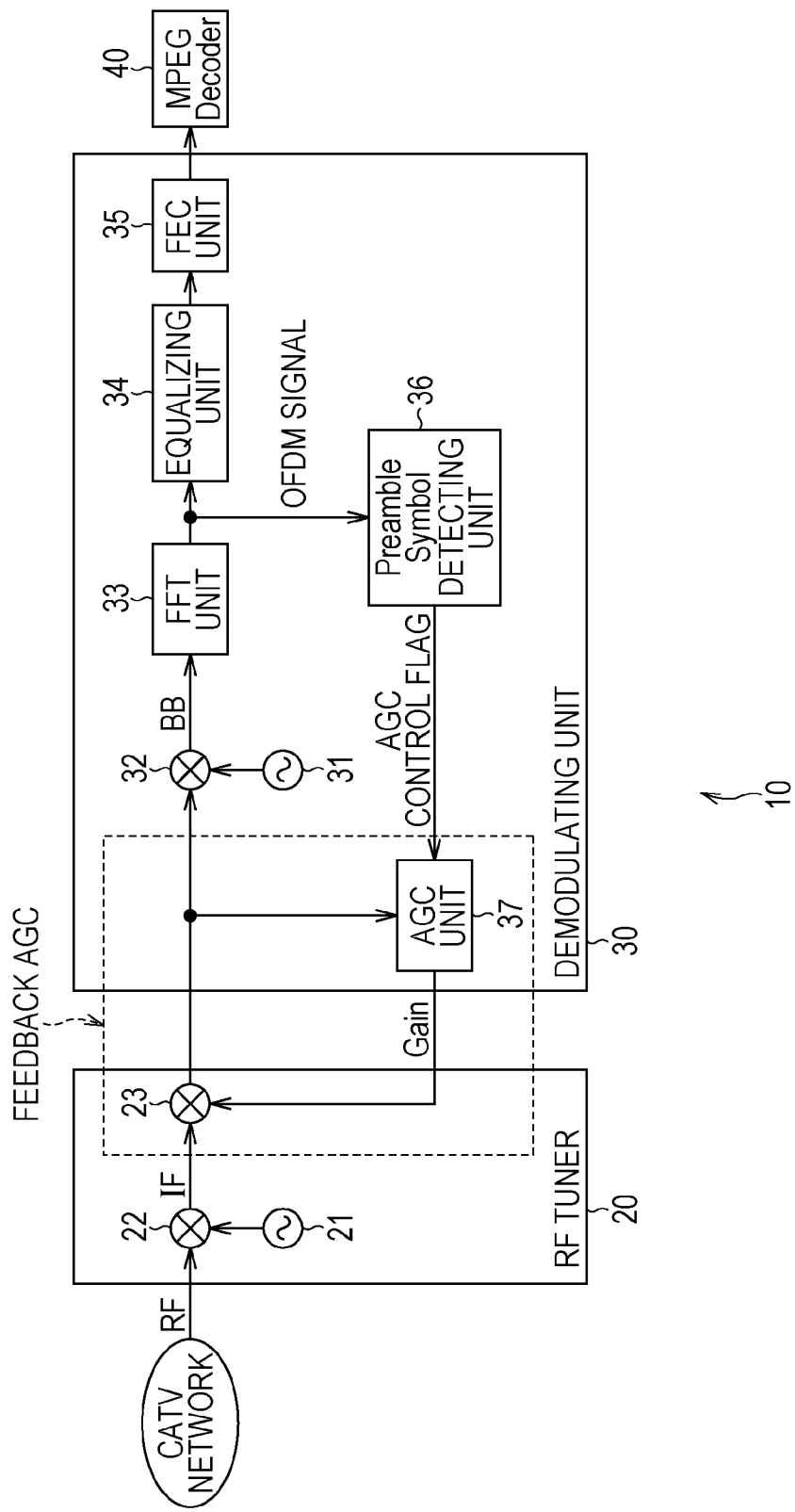
FIG. 9 is a block diagram showing a first example structure of a receiving device as an embodiment of the invention.

FIG. 9 shows a first example structure of a receiving device that can cope with a bias in power that is caused by repetitive bit biases in broadcast signals compliant with DVB-C2 transmitted via a CATV network.

This receiving device 10 has a feedback AGC function, and is formed with an RF tuner 20, a demodulating unit 30, and an MPEG decoder 40.

The RF tuner 20 is formed with a local oscillator 21, a mixer 22, and an IF amplifier 23. The RF tuner 20 extracts the frequency component corresponding to a selected channel from a radio-frequency signal (RF signal) as a broadcast signal that is input via a CATV network, converts the frequency component into an intermediate frequency signal (IF signal), and then outputs the IF signal to the demodulating unit 30. The IF amplifier 23 amplifies the IF signal in accordance with gain that is fed back from an AGC unit 37 of the demodulating unit 30.

The demodulating unit 30 is formed with a local oscillator 31, a mixer 32, an FFT unit 33, an equalizing unit 34, an FEC unit 35, a Preamble Symbol detecting unit 36, and the AGC unit 37. The demodulating unit 30 down-converts the IF signal that is input from the RF tuner 20, to a baseband signal (BB signal), and outputs the resultant encoded signal to the MPEG decoder 40.

The Preamble Symbol detecting unit 36 detects the Preamble Symbol interval based on the pilot signal contained in the OFDM signal output from the FFT unit 33, and sends the AGC unit 37 an AGC control flag indicating that the interval is the Preamble Symbol interval. The AGC unit 37 determines the gain of the IF amplifier 23 of the RF tuner 20 in accordance with the power of the IF signal, and then reports the determined gain.

However, when the AGC control flag is sent from the Preamble Symbol detecting unit 36, the AGC unit 37 suspends its operation. Accordingly, the gain obtained prior to the suspension of the operation of the AGC unit 37 is maintained at the IF amplifier 23. When the AGC control flag is sent from the Preamble Symbol detecting unit 36, the following rate at which the gain is varied in accordance with the power of the IF signal may be lowered, while the operation is not suspended.

The MPEG decoder 40 decodes the encoded signal that is input from the demodulating unit 30, and outputs the resultant AV signal of a television show to a monitor (not shown) in a later stage.

As the receiving device 10 is assumed to receive broadcast signals compliant with DVB-C2, the OFDM signals that are output from the FFT unit 33 are input to the Preamble Symbol detecting unit 36. In a case where the receiving device 10 is assumed to receive broadcast signals compliant with DVB-T2, however, the BB signals that are output from the mixer 32 are input to the Preamble Symbol detecting unit 36.

[Description of Operation]

Figure 10:
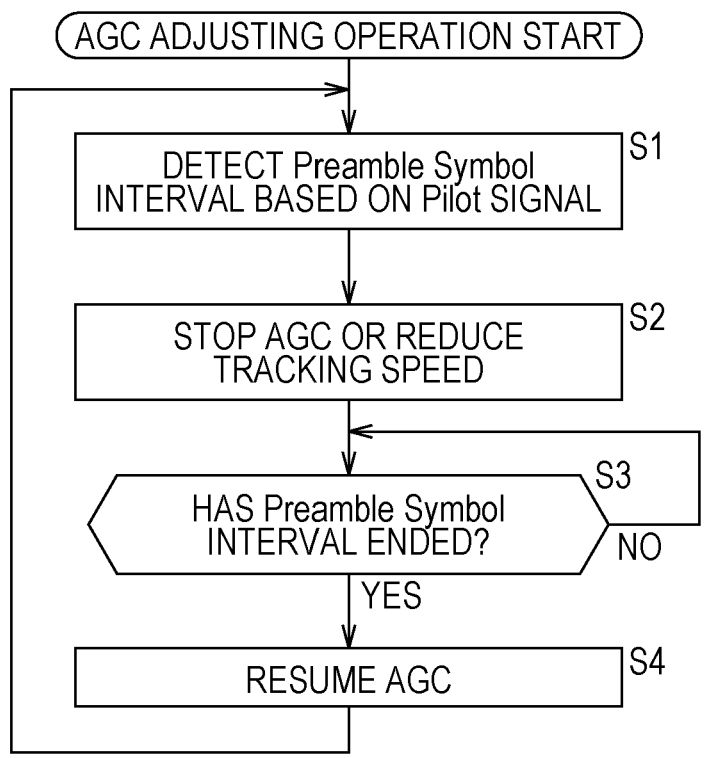
FIG. 10 is a flowchart for explaining an AGC adjusting operation.

FIG. 10 is a flowchart for explaining an AGC adjusting operation to be performed by the receiving device 10. This AGC adjusting operation is continuously performed while broadcast signals are received by the receiving device 10.

In step S1, the Preamble Symbol detecting unit 36 detects the Preamble Symbol interval based on the pilot signals contained in the OFDM signal from the FFT unit 33, and sends the AGC unit 37 the AGC control flag indicating that the interval is the Preamble Symbol interval.

Specifically, the detection of the Preamble Symbol interval is performed, the start point being the boundary at which the type of symbol switches from Data Symbol to Preamble Symbol, the end point being the boundary at which the type of symbol switches from Preamble Symbol to Data Symbol. Alternatively, the Preamble Symbol interval is detected by calculating the number of Preamble Symbols based on L1_INFO_SIZE and L1_TI_MODE, which are obtained by decoding the Preamble Headers, with the start point being the boundary at which the type of symbol switches from Data Symbol to Preamble Symbol.

In step S2, the AGC unit 37 stops determining the gain of the IF amplifier 23 and reporting the gain in accordance with the AGC control flag. As a result, the gain of the IF amplifier 23 is temporarily fixed. The AGC unit 37 also lowers the following rate at which the gain varies with the power of the IF signal. As a result, the rate of change in the gain is reduced.

In step S3, the Preamble Symbol detecting unit 36 determines whether the Preamble Symbol interval has come to an end, and stands by until determining that the Preamble interval has come to an end. Meanwhile, the sending of the AGC control flag is continued. After that, when the Preamble Symbol interval is determined to have come to an end, the operation moves on to step S4. In step S4, the Preamble Symbol detecting unit 36 stops sending the AGC flag to the AGC unit 37. In response to that, the AGC unit 37 resumes the regular operation (determining the gain of the IF amplifier 23 in accordance with the power of the IF signal, and reporting the gain). After that, the operation returns to step S1, and the procedures thereafter are repeated.

Through the AGC control operation described above, large variations in the gain of the IF amplifier 23 can be prevented even when the power of the IF signal is much larger or smaller than that before and after.

Figure 11:
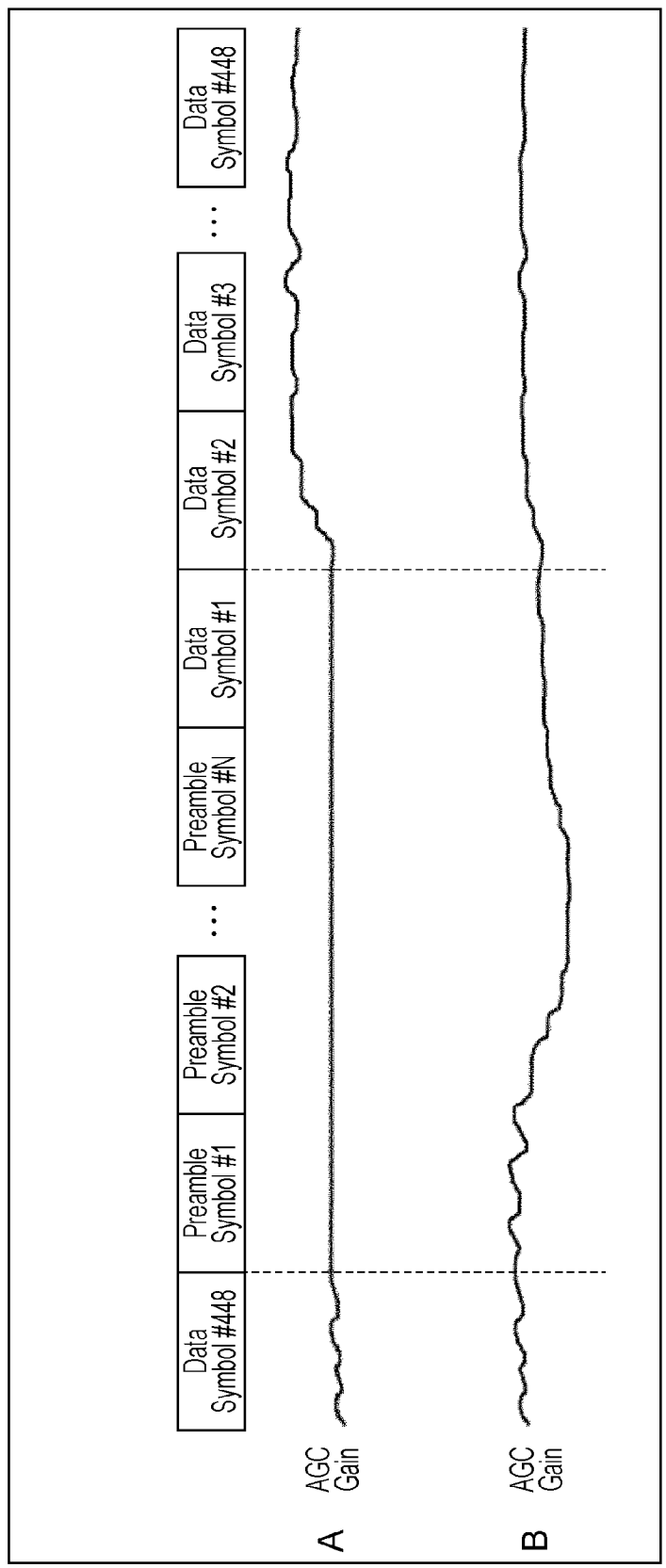
FIG. 11 is a diagram for explaining the effects of the AGC adjusting operation.

FIG. 11 illustrates an operation to be performed by the receiving device 10 in a case where the power of Preamble Symbol #2 is much larger or smaller than that before and after as shown in FIG. 8.

When the AGC unit 37 stops determining and reporting the gain of the IF amplifier 23 in accordance with the AGC control flag, the gain of the IF amplifier 23 is temporarily fixed as shown in A of FIG. 11. When the AGC unit 37 lowers the following rate at which the gain varies with the power of the IF signal, the rate of change in the gain is reduced as shown in B of FIG. 11. Accordingly, demodulation errors can be prevented from occurring at the demodulating unit 30.

[Second Example Structure of a Receiving Device]

FIG. 12 shows a second example structure of a receiving device that can cope with a bias in power that is caused by repetitive bit biases in a broadcast signal compliant with DVB-C2 transmitted via a CATV network. The same components as those of the receiving device 10 of the first example structure are denoted by the same reference numerals as those used in the first example structure, and explanation of them is not repeated herein.

This receiving device 50 has a feedback AGC function and a feedforward AGC function, and differs from the receiving device 10 in further including a BB amplifier 61 and an AGC unit 62.

The BB amplifier 61 amplifies a BB signal in accordance with the gain determined by the AGC unit 62 in accordance with the power of the BB signal, and outputs the resultant signal to a later stage. Like the AGC unit 37, the AGC unit 62 determines the gain of the BB amplifier 61 in accordance with the power of the BB signal, and then reports the determined gain. However, when the AGC control flag is sent from the Preamble Symbol detecting unit 36, the AGC unit 62 suspends its operation.

The operation of the receiving device 50 is the same as the above described operation of the receiving device 10, and therefore, explanation of it will not be repeated herein.

This disclosure can be applied not only to the receiving devices 10 and 50 of the embodiments that are assumed to receive broadcast signals compliant with DVB-C2, but also to various receiving devices having an AGC function.

The above described series of operations can be performed by hardware, and can also be performed by software. In a case where the series of operations are performed by software, the program of the software is installed from a program recording medium into a computer incorporated into special-purpose hardware or a general-purpose personal computer that can execute various functions by installing various programs, for example.

FIG. 13 is a block diagram showing an example structure of the hardware of a computer that performs the above described series of operations in accordance with a program.

In this computer 100, a CPU (Central Processing Unit) 101, a ROM (Read Only Memory) 102, and a RAM (Random Access Memory) 103 are connected to one another by a bus 104.

An input/output interface 105 is further connected to the bus 104. An input unit 106 formed with a keyboard, a mouse, a microphone, and the like, an output unit 107 formed with a display, a speaker, and the like, a storage unit 108 formed with a hard disk, a nonvolatile memory, or the like, a communication unit 109 formed with a network interface or the like, and a drive 110 that drives a removable medium 111 such as a magnetic disk, an optical disk, a magneto optical disk, or a semiconductor memory are connected to the input/output interface 105.

In the computer 100 having the above described structure, the CPU 101 loads a program stored in the storage unit 108 into the RAM 103 via the input/output interface 105 and the bus 104, and executes the program, so that the above described series of operations are performed.

The program to be executed by the computer may be a program for performing operations in chronological order in accordance with the sequence described in this specification, or may be programs for performing operations in parallel or performing an operation when necessary, such as when there is a call.

The program may be executed by one computer, or may be executed by computers in a distributive manner. Further, the program may be transferred to a remote computer, and be executed therein.

It should be noted that embodiments of the present invention are not limited to the above described embodiments, and various modifications may be made to them without departing from the scope of the invention.

REFERENCE SIGNS LIST 10 receiving device, 20 RF tuner, 23 IF amplifier, 30 modulating unit, 36 Preamble Symbol detecting unit, 37 AGC unit, 50 receiving device, 61 BB amplifier, 62 AGC unit

The invention claimed is:

1. A receiving device comprising:
an amplifying unit configured to amplify a received signal;
an adjusting unit configured to adjust gain of the amplifying unit in accordance with power of the signal;
a demodulating unit configured to demodulate the amplified signal; and
a detecting unit configured to detect an interval from the signal, information having the same content continuously appearing in the interval,
wherein the adjusting unit restricts a process of adjusting the gain of the amplifying unit in accordance with a result of the detection of the interval.

2. The receiving device according to claim 1, wherein the adjusting unit suspends the process of adjusting the gain of the amplifying unit in the interval.

3. The receiving device according to claim 1, wherein the adjusting unit lowers the following rate of the gain of the amplifying unit when the gain is adjusted in accordance with the amplified power of the signal in the interval.

4. The receiving device according to claim 2, wherein the adjusting unit is of at least one of a feedback type that has the amplified signal as an input, and a feedforward type that has the pre-amplification signal as an input.

5. A receiving method for a receiving device that includes:
an amplifying unit configured to amplify a received signal;
an adjusting unit configured to adjust gain of the amplifying unit in accordance with power of the signal; and
a demodulating unit configured to demodulate the amplified signal,
the receiving method comprising:
a detecting step of detecting an interval from the signal, information having the same content continuously appearing in the interval; and
a restricting step of restricting the process of adjusting the gain of the amplifying unit in accordance with a result of the detection of the interval.

6. A program for control in a receiving device that includes:
an amplifying unit configured to amplify a received signal;
an adjusting unit configured to adjust gain of the amplifying unit in accordance with power of the signal; and
a demodulating unit configured to demodulate the amplified signal, the program causing a computer of the receiving device to perform an operation that includes:
a detecting step of detecting an interval from the signal, information having the same content continuously appearing in the interval; and
a restricting step of restricting the process of adjusting the gain of the amplifying unit in accordance with a result of the detection of the interval.

* * * * *